(12) United States Patent
Kwon et al.

(10) Patent No.: US 7,608,902 B2
(45) Date of Patent: Oct. 27, 2009

(54) NANOWIRE COMPOSITE AND PREPARATION METHOD THEREOF

(75) Inventors: Soon Jae Kwon, Seongnam-si (KR); Byoung Lyong Choi, Seoul (KR); Eun Kyung Lee, Suwon-si (KR); Kyung Sang Cho, Gwacheon-si (KR); In Taek Han, Seoul (KR); Jae Ho Lee, Yongin-Si (KR); Seong Jae Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/441,989

(22) Filed: May 26, 2006

(65) Prior Publication Data

US 2007/0235714 A1     Oct. 11, 2007

(30) Foreign Application Priority Data

Apr. 6, 2006     (KR) ...................... 10-2006-0031390

(51) Int. Cl.
*H01L 27/12* (2006.01)
(52) U.S. Cl. ......................... 257/428; 257/9; 257/443; 257/465; 257/E27.009; 977/764; 977/784; 977/785; 977/953; 977/957
(58) Field of Classification Search .................. 257/9, 257/428, 443, 465, E27.009; 977/764, 784, 977/785, 953, 957, 958
See application file for complete search history.

(56) References Cited

U.S. PATENT DOCUMENTS

| | | | | |
|---|---|---|---|---|
| 5,264,722 A | * | 11/1993 | Tonucci et al. | 257/443 |
| 6,465,132 B1 | | 10/2002 | Jin | |
| 2005/0062033 A1 | * | 3/2005 | Ichihara et al. | 257/17 |
| 2005/0064185 A1 | * | 3/2005 | Buretea et al. | 428/364 |
| 2006/0038990 A1 | | 2/2006 | Habib et al. | |

FOREIGN PATENT DOCUMENTS

EP      0 951 047 A2     10/1999

OTHER PUBLICATIONS

Park, electroluminescence in n-ZnO nanorod arrays vertically grown on p-GaN, Adv. Mater. 16, 87-90, 2004.*

* cited by examiner

*Primary Examiner*—Kiesha L Rose
*Assistant Examiner*—Minchul Yang
(74) *Attorney, Agent, or Firm*—Cantor Colburn LLP

(57) ABSTRACT

A nanowire composite and a method of preparing the nanowire composite comprise a template having a plurality of hollow channels, nanowires formed within the respective channels of the template, and a functional element formed by removing a portion of the template so that one or more of the nanowires formed within the portion of the template are exposed. Since the nanowire composite can be prepared in a simple manner at low costs and can be miniaturized, the nanowire composite finds application in resonators and a variety of sensors.

10 Claims, 3 Drawing Sheets

NANOWIRE COMPOSITE AND PREPARATION METHOD THEREOF

This application claims priority to Korean Patent Application No. 2006-31390, filed on Apr. 6, 2006, and all the benefits accruing therefrom under 35 U.S.C. § 119(a), the contents of which in its entirety are herein incorporated by reference.

BACKGROUND OF THE INVENTION

1. Field of the Invention

The present invention relates to a nanowire composite and a method of preparing the nanowire composite. More specifically, the present invention relates to a nanowire composite that includes a template having a plurality of hollow channels, nanowires formed within respective channels of the template, and a functional element formed by removing a portion of the template so that one or more of the nanowires formed within the portion of the template are exposed outside of the template, and to a method of preparing the nanowire composite.

2. Description of the Related Art

Resonators are currently used as small-sized and lightweight filters of mobile communication terminals and other devices. Conventional air-gap resonators include a resonance element and an air gap formed under the resonance element. The resonance element includes a bottom electrode, a piezoelectric layer and a top electrode sequentially laminated from the bottom to the top, and the resonance element and an underlying substrate are separated by the air gap. Such an air-gap resonator is commonly fabricated by forming a via hole extending from the outside of the device to a sacrificial layer formed within the device and feeding an etching solution into the device through the via hole to remove the sacrificial layer, thereby forming an air gap at the position where the sacrificial layer is removed. However, this method requires the use of a sacrificial layer, rendering the fabrication procedure complex. In addition, since etching must be performed through a via hole, damage to the resonator is inevitable, thus causing deteriorating the resonance characteristics of the resonator. Furthermore, etching of the air gap on a scale of 30 nm or less has been recognized as being difficult.

On the other hand, a variety of substance sensors capable of detecting various biological substances, chemical substances, environmental substances, gases and the like have received recent attention. In particular, active developments are being made in sensors capable of detecting and analyzing various substances. More particularly, such developments include a sensor that detects the amounts of substances that are surface-adsorbed on the sensor based on piezoelectronic properties. The sensor is operated by measuring variations in resonance frequency due to subject substances and comparing the measured variations with data previously stored in a database.

The thinner a sensing element of the sensor becomes, the better the sensitivity of the sensor. However, the formation of a thin sensing element is difficult due to current technological limitations. Thus, there remains a need to develop a material or method that can be used to fabricate small-sized, highly sensitive sensors capable of simultaneously detecting various substances of samples in an easy manner, even substances in small amounts.

BRIEF SUMMARY OF THE INVENTION

The present invention satisfies the above technical need, and an aspect of the present invention includes providing a nanowire composite for use in a resonator or a sensor that can be miniaturized and is easy to fabricate.

Another aspect of the present invention includes providing a method for preparing a nanowire composite in a simple manner and low cost.

Yet another aspect of the present invention includes providing electronic devices, e.g., resonators and sensors, that can be reduced in size and thickness and are fabricated at low costs wherein the electronic devices comprise the nanowire composite.

In accordance with an exemplary embodiment of the present invention a nanowire composite includes: a template having a plurality of hollow channels; nanowires formed within the respective channels of the template; and a functional element formed by removing a portion of the template so that one or more of the nanowires formed within the portion of the template are exposed.

In accordance with another exemplary embodiment of the present invention, a method of preparing a nanowire composite includes: forming nanowires using a template with a plurality of hollow channels; and removing a portion of the template by etching so that the nanowires formed within the portion of the template are exposed.

Using the template to form the nanowires may include filling the respective channels of the template with a liquid or vapor precursor of a metal, a metal alloy, a metal sulfide, a metal chalcogenide or a metal halogenide; and crystallizing the precursor to form inorganic nanowires. In an exemplary embodiment of a method of the present invention, UV irradiation, microwave irradiation or conventional heating may be employed to form the precursor filled within the channels into crystalline nanowires.

The etching includes performing wet or dry etching to remove a portion of the template and expose the nanowires formed within the portion of the template, thereby forming a working element functioning as a resonance element of a resonator or a sensing element of a sensor.

In accordance with yet another exemplary embodiment of the present invention, a resonator or a multifunctional sensor includes the nanowire composite.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
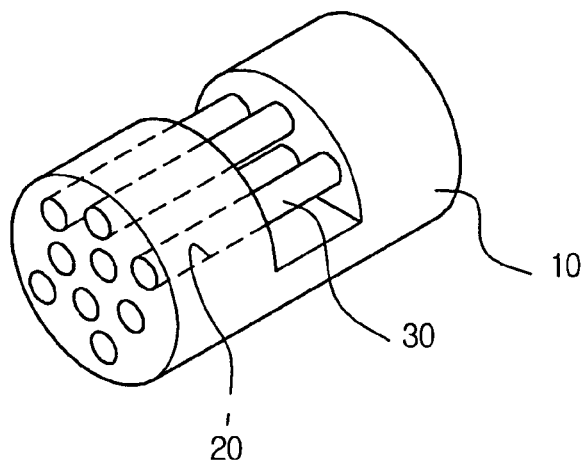
FIG. 1 is a schematic perspective view of an exemplary embodiment of a nanowire composite according to the present invention.

The present invention will now be described more fully hereinafter with reference to the accompanying drawings, in which exemplary embodiments of the present invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In exemplary embodiments, the present invention is directed to a nanowire composite comprising a plurality of nanowires formed within channels of a template and a functional element formed by exposing a portion of the nanowires so as to function as a functional element. The functional element includes a resonance element of a resonator or a sensing element of a sensor, for example.

FIG. 1 is a schematic perspective view of an exemplary embodiment of a nanowire composite according to the present invention. With reference to FIG. 1, the nanowire composite of the present invention comprises a template 10 having a plurality of hollow channels, nanowires 20 formed within the respective channels of the template, and a functional element 30 formed by removing a portion of the template so that one or more of the nanowires formed within the portion of the template are exposed outside of the template.

The template 10 has a plurality of hollow channels within which the nanowires 20 are formed. The template 10 may be made of a material selected from the group consisting of glass, silica and metal oxides, such as $TiO_2$, $ZnO$, $SnO_2$ and $WO_3$, for example.

The template 10 may be manufactured by preparing a template preform and extracting a template form from the template preform. The formation of channels is determined depending on the extraction speed and cooling conditions. More particularly, a structure in which the initial shape is reduced to a nanometer scale can be attained by extraction by previously processing the desired channel shape of the preform.

Since the diameter and length of the template 10 have a high degree of freedom, they can be selected according to the size of the channels in which nanowires 20 are grown. In exemplary embodiments, the template 10 has a diameter of about 10 nm to about 1 mm and a length of about 100 nm to about 1 mm. The dimensions of the channels formed within the template 10 and spacing between the channels may be varied depending upon the specification of the nanowires 20 and a nanowire structure to be prepared. In exemplary embodiments, the channels have a diameter of about 1 nm to about 100 nm and a spacing of about 2 nm to about 1 μm.

The nanowires 20 formed within the channels of the template 10 have a diameter ranging from about 1 nm to about 100 nm and have a very high length-to-diameter ratio. Examples of suitable materials for the nanowires 20 include, for example, but are not limited to, metals, metal alloys, metal sulfides, metal chalcogenides, metal halogenides and semiconductors. Specifically, the nanowires 20 may be made of at least one material selected from the group consisting of Fe, Pt, Ni, Co, Al, Ag, Au, Cu, Si, Ge, CdS, CdSe, CdTe, ZnS, ZnSe, ZnTe, GaN, GaP, GaAs, GaSb, AlN, AlP, AlAs, AlSb, InP, InAs, InSb, SiC, FePt, $Fe_2O_3$ and $Fe_3O_4$.

The functional element 30 of the nanowire composite according to the present invention is formed by etching a portion of the template 10 so that the nanowires 20 formed within the portion of the template 10 are exposed outside of the template 10. The functional element 30 functions as a resonance element of a resonator or a sensing element of a sensor, for example. The functional element 30 of the nanowire composite according to the present invention may be composed of a single strand or a plurality of strands of the nanowires 20. The nanowire composite of the present invention can be used in the fabrication of a variety of sensors and resonators.

In another aspect, the present invention is directed to a method of preparing the nanowire composite. Specifically, the method of the present invention includes forming nanowires within respective hollow channels of a template and etching a portion of the template so that the nanowires formed within the portion of the template are exposed outside of the template.

Figure 2:
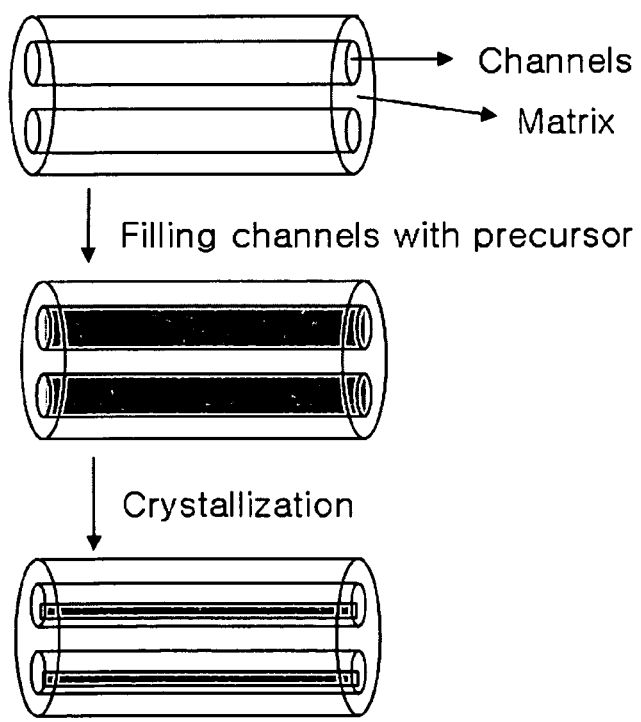
FIG. 2 are process flow diagrams illustrating forming nanowires in an exemplary embodiment of a method for preparing a nanowire composite according to the present invention.
Figure 3:
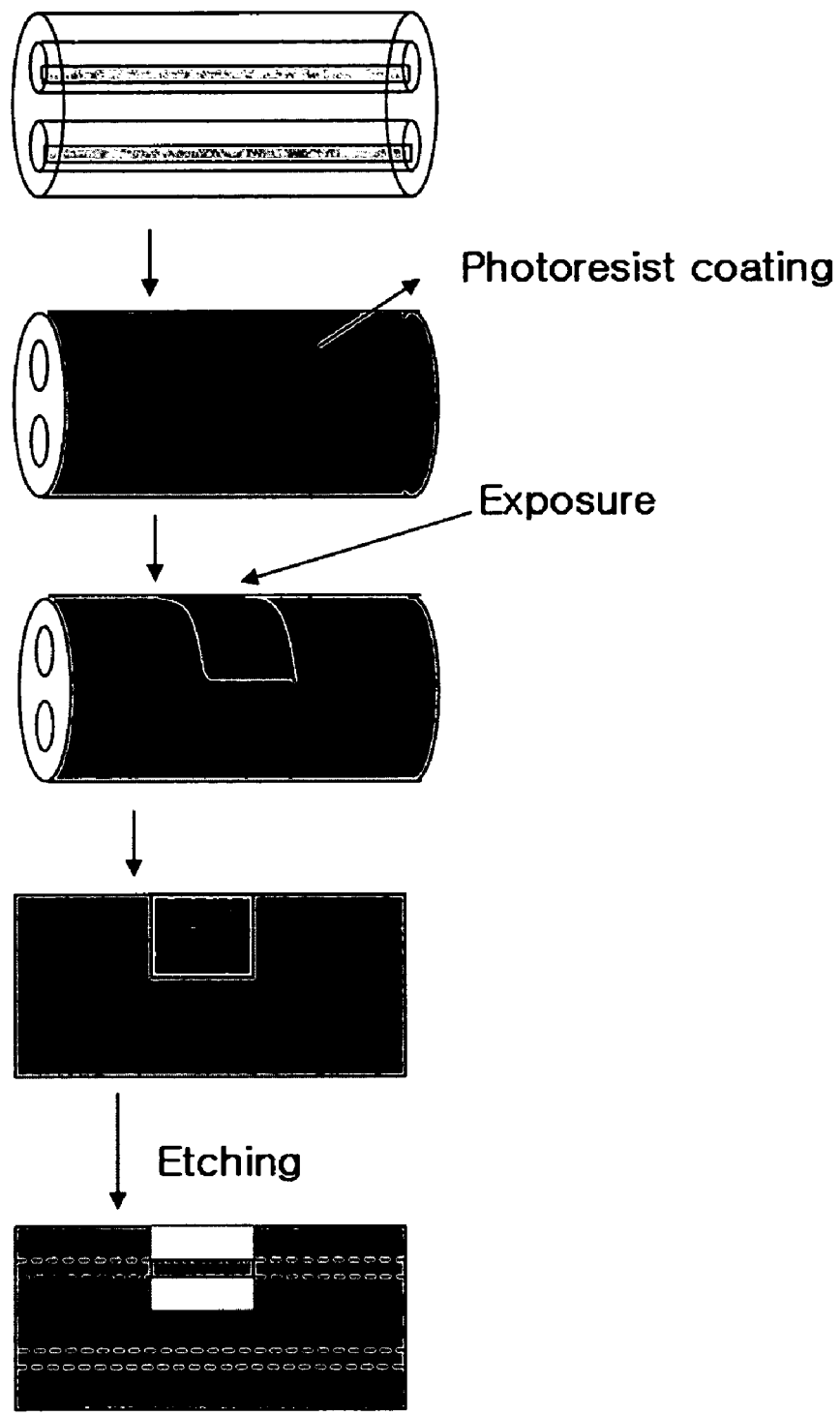
FIG. 3 are process flow diagrams illustrating etching a template in an exemplary embodiment of a method for preparing a nanowire composite according to the present invention.

FIGS. 2 and 3 are process flow diagrams illustrating forming nanowires and etching a template in an exemplary embodiment of a method for preparing a nanowire composite according to the present invention, respectively. Referring to FIGS. 2 and 3, a more detailed explanation of the method for preparing nanowires according to the present invention will be provided.

According to the method of the present invention, nanowires are formed using a template with a plurality of hollow channels. Then a portion of the template is removed by etching so that the nanowires formed within the portion of the template are exposed outside of the template.

Specifically, a liquid or vapor precursor of a metal, a metal alloy, a metal sulfide, a metal chalcogenide or a metal halogenide (e.g., AgI or $HgI_2$) is filled into respective channels of the template, and then the precursor is crystallized to form nanowires. Examples of materials for the nanowires include, but are not limited to, Fe, Pt, Ni, Co, Al, Ag, Au, Cu, Si, Ge, CdS, CdSe, CdTe, ZnS, ZnSe, ZnTe, GaN, GaP, GaAs, GaSb, AlN, AlP, AlAs, AlSb, InP, InAs, InSb, SiC, FePt, $Fe_2O_3$ and $Fe_3O_4$.

In the case where a solution process is applied to the production of nanowires, a precursor of a metal element, e.g., Fe, Pt, Ag or Cd, may be in the form of a metal salt, e.g., nitrate (e.g., $Fe(NO_3)_3$ or $AgNO_3$), chloride (e.g., $FeCl_3$), acetate (e.g., $Ag(CH_3COO)$ or $Cd(CH_3COO)_2$), or an organometallic compound, e.g., dimethylzinc ($ZnMe_2$, $Me=CH_3$) or dimethylcadmium ($CdMe_2$, $Me=CH_3$). The solution process adopts a solution of the precursor in a polar organic solvent, e.g., water, alcohol, dimethylformamide or ethylenediamine. A reducing agent, e.g., $NaBH_4$, may be added to the solution of the metal precursor to facilitate the reductive reaction from the precursor into the metal element. If required, the precursor solution may be prepared by dissolving the precursor in an appropriate solvent, such as a $C_6$-$C_{22}$ alkyl phosphine, a $C_6$-$C_{22}$ alkyl phosphine oxide, a $C_6$-$C_{22}$ alkyl amine or a mixture thereof, for example.

The filling of the channels with the liquid or vapor precursor may be achieved using a capillary phenomenon. Since the channels of the template have a small size in the nanometer range, the filling may be performed by maintaining both ends of the template at different temperatures or pressures or by applying an electric field or mechanical force to the template. As an example, the filling of the precursor into the channels may be performed by injecting the precursor into the channels through one end of each of the channels and flowing the fluid in a hydrodynamic manner using a micro-pump, or by injecting the precursor into the channels by capillary electrophoresis while applying an electric field at both ends of each of the channels.

Methods for the crystallization of a vapor or liquid precursor to produce nanowires are well known to those skilled in the art. Of these methods, any method may be employed to crystallize nanowires in the present invention. For example, after the liquid or vapor precursor is filled into the respective channels of the template, UV irradiation, microwave irradiation or conventional heating, for example, may be employed to crystallize the precursor into crystalline nanowires.

For instance, a metal or metal alloy precursor can be crystallized by the following reduction reactions:

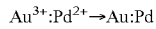

The metal or metal alloy precursor that may be used includes, for example, a nitrate (e.g., $AgNO_3$), a chloride (e.g., $PdCl_2$ or $AuCl_3$) or an acetate (e.g., $Pd(CH_3COO)_2$). A reducing agent (e.g., $NaBH_4$ or hydrazine ($N_2H_4$)) may be added to promote the production of metal nanowires.

On the other hand, a metal sulfide or metal chalcogenide compound may be crystallized by the following reactions:

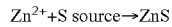

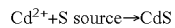

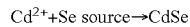

As the sulfur or chalcogenide source, a solution of a precursor of sulfur (S) or a chalcogen element (e.g., Se or Te) may be used in an alkyl phosphine or alkyl phosphine oxide, or a molecular or ionic compound containing the element. Examples of suitable sulfur and chalcogenide precursors include $H_2SeO_3$, $(TMS)_2Se$, $(TMS)_2S$, thiourea ($NH_2CSNH_2$), thioacetamide ($CH_3CSNH_2$), $Na_2TeO_4$, $(BDMS)_2Te$ and NaHTe.

A metal-halogen may be crystallized by the following halogenation reactions:

To form AgI nanowires within channels, a silver (Ag) precursor is filled into channels and chemically transformed into Ag nanowires by reductive reaction, which then react with Iodine ($I_2$) under negative pressure or a vacuum so as to form AgI nanowires within the channels by diffusion of the iodine molecules and/or by ionic conductivity of silver ions ($Ag^+$). To form $HgI_2$ nanowires within channels, a template having the channels is evacuated, and the template is dipped in mercury (Hg), a flowable liquid, so that the channels are filled with the mercury. Thereafter, as in the formation of the AgI nanowires, the mercury is allowed to react with iodine under negative pressure or a vacuum to form $HgI_2$ nanowires within the channels. $HgI_2$ is a compound used in detectors of high-energy radioactive rays, e.g., X-rays and gamma-rays. Accordingly, $HgI_2$ nanowires are expected to be applicable to highly-sensitive X-ray detectors for environmental and medical applications, for example.

After the formation of the nanowires is completed, a portion of the template is removed by etching so that a single strand or a plurality of strands of the nanowires formed within the portion of the template are exposed outside of the template. To this end, as shown in FIG. 3, a photosensitive photoresist composition is coated on the surface of the template, and then a portion of the template to be etched is exposed to light. Since the portion to be exposed to light is not planar but three-dimensional (i.e., cylindrical), the use of a pulsed-laser having a narrow line width enables fine and minute light exposure of the three-dimensional portion (i.e., the cylindrical surface). Since the portion of the template is peeled by the exposure to light, it can be etched using an etchant, such as an etching solution, in the subsequent etching process. The exposed portion of the template is removed by a suitable etching process, e.g., chemical etching. At this time, the etching can be performed by wet or dry etching. As an alternative, the portion of the template may be removed by photoetching, instead of chemical etching.

Wet etching is a process by which only the template is removed using an etchant, e.g., an acetic acid, hydrofluoric acid or phosphoric acid solution, selective for the template. Dry etching is a process by which the template is removed using gas, plasma, ion beam or the like. For the dry etching, a reactive ion etching (RIE) process may be employed wherein a reactive gas is activated in a plasma state to cause a chemical reaction with a material being etched, rendering the material volatile, or an inductive coupled plasma-reactive ion etching ("ICP-RIE") process wherein inductive coupled plasma ("ICP") is used as an activation source.

The diameter of the nanowires may be optionally controlled by adjusting the diameter of the channels of the template, the concentration of the precursor, the reaction time, etc. The diameter of the channels may be controlled to a micrometer or nanometer level. The length of the nanowires may also be optionally controlled.

In yet another aspect, the present invention is directed to a resonator or a sensor comprising the nanowire composite. When it is intended to fabricate a resonator or sensor using the nanowire composite, an electrically conductive material is coated on both sides of the nanowire composite to form electrodes.

Since the nanowire composite prepared by the method of the present invention comprises highly rectilinear and well-ordered nanowires, it can be utilized in the fabrication of sensors, resonators, electronic devices, etc. Particularly, according to exemplary embodiments of a method of the present invention, the sensor devices can be fabricated at low costs without using expensive apparatus or equipment. Examples of the sensors include gas sensors (e.g., hydrogen sensors), chemical sensors, photosensors (e.g., visible light sensors and X-ray sensors) and biosensors. The biosensors can be widely used in medical, food, military, environmental monitoring and research applications.

Figure 4:
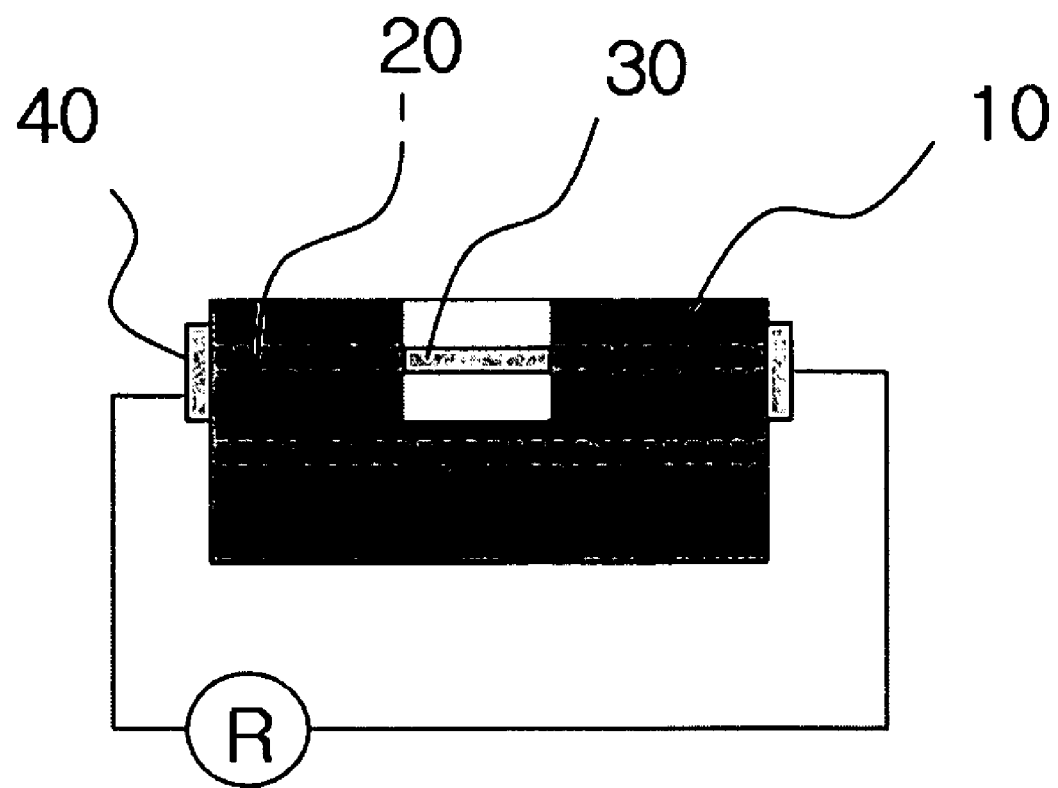
FIG. 4 is a schematic cross-sectional view of a sensor comprising an exemplary embodiment of a nanowire composite according to the present invention.

FIG. 4 is a schematic cross-sectional view of a sensor fabricated using an exemplary embodiment of a nanowire composite of the present invention. The sensor shown in FIG. 4 may be fabricated by forming a nanowire composite comprising a template 10 and a functional element 30 between a pair of electrodes 40. As shown in FIG. 4, the sensor comprising the nanowire composite can be connected to a signal processing circuit on a substrate to manufacture a module.

Examples of suitable substrates that can be used in the present invention include semiconductor, ceramic, e.g., sapphire, glass, polymer and plastic substrates. Examples of suitable materials for the electrodes include metals, e.g., Au, Ti, Pt, Pd and TiN and metal alloys.

Since nanowires have a strong tendency to grow into a single crystal as compared to other materials, changes in physical and chemical properties due to the presence of defects or impurities are excluded or minimized. In addition, since nanowires are highly reactive and sensitive to physical and chemical environmental variations due to a very high surface area (S)-to-volume (V) ratio (S/V) and quantum-size effects of nanowires, nanowires can be effectively used as sensors. Furthermore, since nanowires are sufficiently long in one direction, they can be easily used in the fabrication of devices in comparison with other nanometer-sized materials. Moreover, since semiconductor nanowires show varying electrical resistance by photoexcitation at particular wavelengths, they can be used as photosensors for particular wavelengths.

The resonator using the nanowire composite of the present invention can be used as a sensor. When an additional material is adhered to the resonator, variations in resonance frequency take place. By measuring variations in frequency in response to the amount of a particular material adhered to the resonator and comparing the measured variations with data previously stored in a database, the kind and characteristics of the material can be determined.

The resonator comprising the nanowire composite of the present invention may be used as a filter, duplexer, etc., for mobile communication devices, for example.

Hereinafter, the present invention will be explained in more detail with reference to the following examples. However, these examples are given for the purpose of illustration and are not to be construed as limiting the scope of the invention.

Example 1

Preparation of Nanostructure Composite

A template (diameter 100 μm) having a plurality of 1 μm-long channels (diameter: 20 nm, spacing: 40 nm) was manufactured. The template was placed on a substrate, and then a dispersion of CdSe nanoparticles in toluene was sprayed on the surface of the template. A relatively low pressure was applied to the lower portion of the template for a very short time to fill the channels with the nanoparticles. After completion of the filling with the CdSe nanoparticles, the resulting structure was annealed at 200° C. for 10 minutes to form nanowires within the channels.

Example 2

Preparation of Ag Nanostructure Composite

A template (diameter 100 μm) having a plurality of 1 μm-long channels (diameter: 40 nm, spacing: 40 nm) was manufactured. The template was evacuated, and then a saturated silver acetate ($Ag(CH_3COO)$) solution in ethylene glycol was added thereto. Pressurization was performed to infiltrate the silver acetate ($Ag(CH_3COO)$) solution into the channels. A reaction was allowed to proceed under pressure at 100-150° C. for 20 minutes to form Ag nanowires. A microwave of 2.45 GHz was irradiated for 5 minutes without heating to form Ag nanowires within the channels.

Example 3

Preparation of AgI Nanostructure Composite

The template containing the Ag nanowires formed in Example 2 and iodine ($I_2$) were vacuum-sealed, and heated to 150-250° C. for 2 hours. Thereafter, a temperature gradient was applied in such a manner that the temperature of a portion where the template was positioned was higher than the temperatures of other portions. As a result, the iodine other than AgI was removed to leave AgI nanowires only within the channels.

Example 4

Preparation of ZnSe Nanostructure Composite $1.5 \times 10^{-3}$ moles of $Zn(CH_3COO)$ and $1.5 \times 10^{-3}$ moles of selenourea($NH_2CSeNH_2$) were dissolved in 2 ml of N,N-dimethylformamide, and then a template having channels was dipped in the solution. Thereafter, a microwave of 2.45 GHz was irradiated for 3 minutes or heating was performed under pressure at 200° C. for one hour to form ZnSe nanowires within the channels.

For example, the nanowires used in the present invention may be carbon nanotubes, and the cross-sectional shape and the composition of the nanowires may be changed. That is, the nanowires of the functional element of the nanowire composite constituting a sensing element of a sensor or a resonance element of a resonator may have a hybrid structure in which different materials for the nanowires are alternately formed, or may be modified to have various cross-sectional shapes other than a circular shape in terms of increased surface area. In addition, when the nanowire composite of the present invention is used in the fabrication of sensors, the nanowires remaining unetched within the template may be used as references.

As apparent from the foregoing, according to the method of the present invention, a nanowire composite can be prepared at low costs without using expensive apparatus or equipment. Accordingly, sensors or resonators can also be fabricated in a simple manner at low costs. Particularly, the use of the nanowire composite of the present invention facilitates the fabrication of multifunctional sensors capable of simultaneously detecting various substances even in small amounts of samples.

In addition, since the resonator or sensor of the present invention can be fabricated to have a small size and a small thickness, it can be mounted on boards of portable electronic devices.

Although the present invention has been described herein with reference to the foregoing exemplary embodiments, these exemplary embodiments do not serve to limit the scope of the present invention. Accordingly, those skilled in the art to which the present invention pertains will appreciate that various modifications are possible, without departing from the technical spirit of the present invention.

What is claimed is:

1. A nanowire composite comprising:
    a template having a first surface, a second surface opposite to and parallel to the first surface, and a third surface extending from the first surface to the second surface:
    a plurality of hollow channels disposed in the template and extending therein from the first surface and the second surface;
    nanowires disposed in the plurality of hollow channels; and
    a functional element comprising a portion of one or more of the nanowires exposed through an etched portion of the third surface of the template,
    wherein the functional element does not directly touch the first surface or the second surface of the template.

2. The nanowire composite according to claim 1, wherein the template is made of a material selected from the group consisting of glass, silica, and metal oxides.

3. The nanowire composite according to claim 1, wherein the nanowires are made of a metal, a metal alloy, a metal sulfide, a metal chalcogenide, a metal halogenide or a semiconductor.

4. The nanowire composite according to claim 1, wherein the nanowires are made of at least one material selected from the group consisting of Fe, Pt, Ni, Co, Al, Ag, Au, Cu, Si, Ge, CdS, CdSe, CdTe, ZnS, ZnSe, ZnTe, GaN, GaP, GaAs, GaSb, AlN, AlP, AlAs, AlSb, InP, InAs, JnSb, SiC, FePt, $Fe_2O_3$ and $Fe_3O_4$.

5. The nanowire composite according to claim 1, wherein the template has a diameter of about 10 nm to about 1 mm and a length of about 100 nm to about 1 mm, and the channels have a diameter of about 1 nm to about 100 nm and a spacing of about 2 nm to about 1 μm.

6. The nanowire composite according to claim 1, wherein the functional element is composed of a single strand or a plurality of strands of the nanowires.

7. A resonator comprising:
    a nanowire composite including:
        a template having a first surface, a second surface opposite to and parallel to the first surface, and a third surface extending from the first surface to the second surface:
        a plurality of hollow channels disposed in the template and extending therein from the first surface and the second surface;
        nanowires disposed in the plurality of hollow channels; and
        a functional element comprising a portion of one or more of the nanowires exposed through an etched portion of the third surface of the template,
    wherein the functional element does not directly touch the first surface or the second surface of the template.

8. A sensor comprising:
    a nanowire composite including:
        a template having a first surface, a second surface opposite to and parallel to the first surface, and a third surface extending from the first surface to the second surface;
        a plurality of hollow channels disposed in the template and extending therein from the first surface and the second surface;
        nanowires disposed in the plurality of hollow channels; and
        a functional element comprising a portion of one or more of the nanowires exposed through an etched portion of the third surface of the template,
    wherein the functional element does not directly touch the first surface or the second surface of the template.

9. The sensor according to claim 8, wherein the sensor comprises electrodes coated on both sides of the nanowire composite.

10. The sensor according to claim 8, wherein the sensor is a gas sensor, a chemical sensor, a photosensor or a biosensor.

* * * * *